US009098963B2

(12) United States Patent
Clark et al.

(10) Patent No.: US 9,098,963 B2
(45) Date of Patent: Aug. 4, 2015

(54) FOREIGN BODY DETECTING

(75) Inventors: Barrie Clark, Dundee (GB); Jim Henderson, Dundee (GB)

(73) Assignee: NCR Corporation, Duluth, GA (US)

( * ) Notice: Subject to any disclaimer, the term of this patent is extended or adjusted under 35 U.S.C. 154(b) by 897 days.

(21) Appl. No.: 13/330,293

(22) Filed: Dec. 19, 2011

(65) Prior Publication Data

US 2013/0154612 A1 Jun. 20, 2013

(51) Int. Cl.
*G01R 21/00* (2006.01)
*G07F 19/00* (2006.01)

(52) U.S. Cl.
CPC .......... *G07F 19/207* (2013.01); *G07F 19/2055* (2013.01)

(58) Field of Classification Search
CPC .......................... G07F 19/207; G07F 19/2055
USPC ........................................................ 324/76.77
See application file for complete search history.

(56) References Cited

U.S. PATENT DOCUMENTS

| | | | | |
|---|---|---|---|---|
| 3,493,855 | A * | 2/1970 | Norwich | 324/664 |
| 3,766,315 | A * | 10/1973 | Low et al. | 375/365 |
| 8,236,164 | B2 * | 8/2012 | Gustafsson et al. | 205/788 |
| 8,354,936 | B2 * | 1/2013 | Ootaka | 340/667 |
| 2006/0049048 | A1 * | 3/2006 | Kondo et al. | 204/425 |
| 2006/0226030 | A1 * | 10/2006 | Hanke et al. | 205/792 |
| 2009/0140722 | A1 * | 6/2009 | Mann et al. | 324/120 |
| 2009/0164156 | A1 * | 6/2009 | Colston et al. | 702/65 |
| 2010/0171515 | A1 * | 7/2010 | Nakagawa et al. | 324/658 |

* cited by examiner

*Primary Examiner* — Patrick Assouad
*Assistant Examiner* — Demetrius Pretlow
(74) *Attorney, Agent, or Firm* — Paul W. Martin

(57) ABSTRACT

A method of operating a sensor 112 having a first transmit plate 114, a second receive plate 115 and a dielectric material between the two plates 114, 115. The method comprises the steps of: applying an alternating across the transmit and receive plates 114, 115, thereby to create an alternating electric field, which applied voltage results in a current $I_z$ flowing through the two plates 114, 115; producing a voltage signal corresponding to the resultant current $I_z$; determining the average value of the product of the corresponding voltage signal and a reference voltage signal $V_{ref3}$; and adjusting the phase of the reference voltage $V_{ref3}$ until a null condition is achieved, at which condition the average value is approximately zero. A sensor 112 is also disclosed.

14 Claims, 4 Drawing Sheets

FOREIGN BODY DETECTING

FIELD OF THE INVENTION

The present invention relates to foreign body detecting in the context of self-service terminals, such as automated teller machines (ATMs). In particular, although not exclusively, the invention relates to distinguishing between benign and non-benign foreign bodies.

BACKGROUND TO THE INVENTION

ATMs are used, for example, to dispense cash and for depositing cash or cheques. Typically, a customer operates an ATM by inserting a magnetic stripe card, encoded with the customer's personal and account data, into a slot in the fascia of the machine, behind which is a card reader.

Fraudsters have devised a number of schemes for stealing customers' magnetic card data. One scheme, known as "skimming", involves fixing a magnetic read head to the fascia of a machine, which reads the magnetic stripe on a customer's card as it is inserted into or retrieved from the machine, and stores and/or relays the read data to a remote location.

Anything applied, fixed, fitted or adhered to or that settles on, engages or contacts the fascia of an ATM after it has been commissioned, that was not put there by an authorised party for a legitimate reason, is called a "foreign body", although the term "body" includes not only solid objects but also liquids in whatever form (droplets, films, puddles etc.). There are two types of foreign bodies: those that are non-benign, that is, intended to defraud, cause disruption or deception, such as magnetic read heads, and those that are benign, such as rainwater.

Principally with a view to counteracting fraud, ATMs have been equipped with sensors that detect foreign bodies. One particular sensor works by determining changes in capacitance caused by a foreign body. However, both non-benign and benign foreign bodies can cause capacitance changes. Ideally, therefore, it is important to be able to distinguish between them.

Early magnetic read heads tended to be relatively big, which meant they would cause a significant capacitance change. Consequently, they could be distinguished from, for example, rainwater, which does not have such a dramatic effect on capacitance, by setting a high threshold. But as read head technology has developed and heads have become a lot smaller, it has been necessary to lower the detection threshold to the extent that it is now difficult to distinguish between read heads and, for example, rainwater.

SUMMARY OF THE INVENTION

Accordingly, the invention generally provides methods of and systems for providing improved sensing of foreign bodies. In particular, the invention provides an improved ability to distinguish between benign and non-benign foreign bodies.

According to a first aspect there is provided a method of operating a sensor comprising a first transmit plate, a second receive plate and dielectric material between the two plates, the method comprising:

applying an alternating voltage across the transmit and receive plates, thereby to create an alternating electric field, which applied voltage results in a current flowing between the plates;

producing a voltage signal corresponding to the resultant current;

determining the average value of the product of the corresponding voltage signal and a reference voltage signal; and adjusting the phase of the reference voltage signal until a null condition is achieved, at which condition the average value is approximately zero.

Different foreign bodies have different characteristic impedances. Each body's impedance is determined by the electrical characteristics of its constituent elements, that is, net reactive and resistive components. As a consequence, each different body, when placed in a position that will affect the field, will result in a current flowing through the plates with a phase relationship to the applied voltage that is specific to that body. By determining the phase of the current, it is possible to determine the type of foreign body, which means that it is possible to distinguish between foreign bodies.

The sensor may be first set up so that, without any foreign body in a position to affect the field, which situation is termed the steady state, a null condition is achieved. When a foreign body is introduced into a position to affect the field between the plates, it causes a change in the resultant current, and the phase of the reference voltage may be adjusted until the null condition is again achieved, in which case the adjustment is indicative of the type of foreign body.

Alternatively, the sensor may be desensitised to a particular foreign body by setting the sensor up such that a null condition is achieved when that foreign body is present. Then, any non-null condition is indicative that another foreign body is present. This can be useful, for instance, if it is known that rainwater is likely to be present, in which case a null condition is established when rainwater is present and a non-null condition is induced when another foreign body is present.

The applied alternating voltage may have a symmetric alternating waveform.

The reference voltage signal may have a symmetric alternating waveform. The reference voltage signal may lag or lead the applied voltage by 90°.

The method may further comprise characterising a range of foreign bodies in terms of the adjustment of the reference voltage from the steady state required to restore a null condition.

According to a second aspect there is provided a sensor comprising:

a first transmit plate:

a second receive plate;

dielectric material between the two plates;

a voltage generator generating an alternating voltage across the transmit and receive plates thereby to create an alternating electric field, which applied voltage results in a current flowing between the plates;

a converter producing a voltage signal corresponding to the resultant current;

a calculating arrangement determining the average value of the product of the corresponding voltage signal and an alternating reference voltage signal; and a phase shifter adjusting the phase of the reference voltage signal until a null condition is achieved, at which condition the average value is approximately zero.

The dielectric material may be air.

The applied alternating voltage may be applied to the transmit plate via an amplifier.

The converter may be a trans-impedance amplifier.

The calculating arrangement may comprise a mixer and an integrator.

The reference voltage signal may be produced by applying the voltage from the voltage generator to the phase shifter.

According to a third aspect there is provided an ATM operated according to the first aspect.

According to a fourth aspect there is provided an ATM comprising the second aspect.

It will be appreciated that although adjusting the phase of the reference voltage to achieve a null condition is preferred, the phase of the reference voltage could equally well be adjusted until some other particular condition is achieved, at which the average value could be something other than zero.

According to a fifth aspect there is provided a method of operating a sensor comprising:

a first transmit plate, a second receive plate and a dielectric material between the two plates, the method comprising the steps of:

applying an alternating voltage across the transmit and receive plates thereby to create an alternating electric field, which applied voltage results in a current flowing between the two plates;

producing a voltage signal corresponding to the resultant current;

determining the average value of the product of the corresponding voltage signal and a reference voltage signal; and adjusting the phase of the reference voltage until a particular condition is achieved.

According to a sixth a sensor comprising:

a first transmit plate;

a second receive plate;

dielectric material between the two plates;

a voltage generator for generating an alternating voltage applied across the transmit and receive plates thereby to create an alternating electric field, which applied voltage results in a current flowing between the two plates;

a convertor producing a voltage signal corresponding to the resultant current;

a calculating arrangement determining the average value of the product of the corresponding voltage signal and the alternating reference voltage signal; and a phase shifter adjusting the phase of the reference voltage signal until a particular condition is achieved.

DESCRIPTION OF EMBODIMENTS

Figure 1:
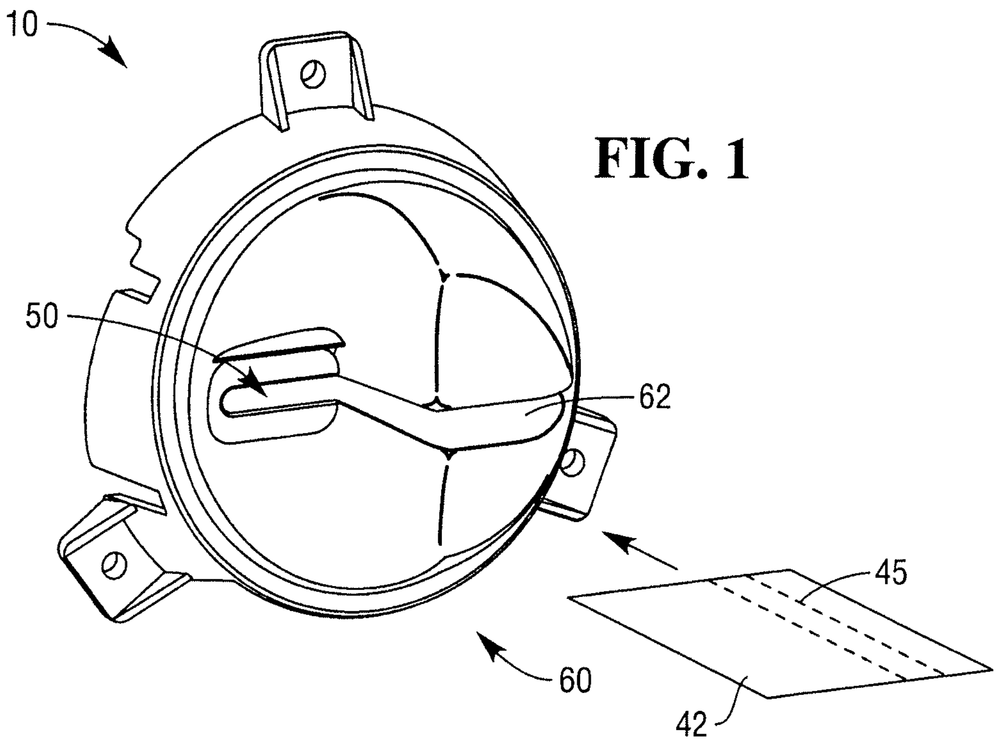
FIG. 1 is a front perspective view of the card reader guide of an ATM.
Figure 2:
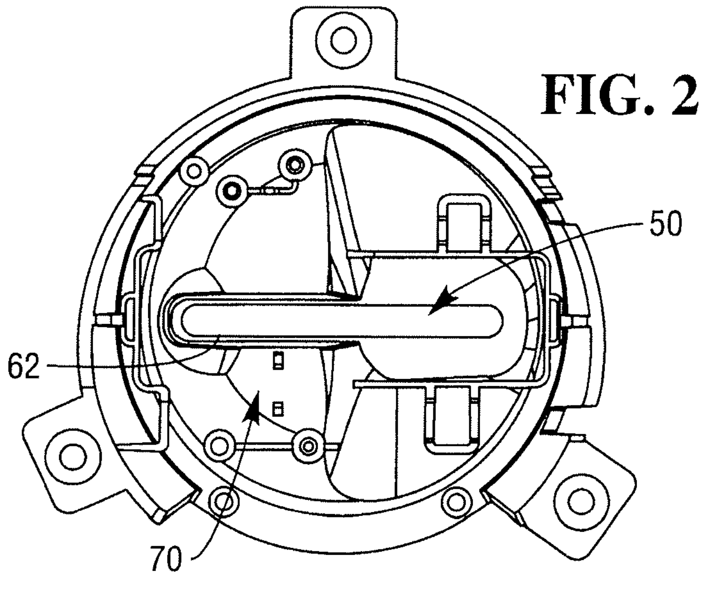
FIG. 2 is a rear perspective view of the card reader guide of FIG. 1.

With reference to FIGS. 1 and 2, a card reader guide 10 comprises a moulded plastics part dimensioned to be accommodated within, and partially protrude through, an aperture in the fascia of an ATM (not shown). The card reader guide 10 defines a card slot 50 extending generally horizontally across the guide 10. FIG. 1 also shows a data card 42 (in the form of a magnetic stripe card) aligned with the card reader guide 10.

The card reader guide 10 is operable to receive the magnetic stripe card 42, which is inserted into the slot 50 by a customer. A magnetic stripe 45 is carried on the lower side of the card 42. The card reader guide 10 also defines a first, lower protrusion 60 which includes planar section 62 across which the magnetic stripe 45 passes as the card is inserted. The first protrusion 60 also defines a cavity (best seen in FIG. 2 and shown generally by an arrow 70) which is referred to hereinafter as the "sensor cavity", and which is beneath the planar section 62.

Figure 3:
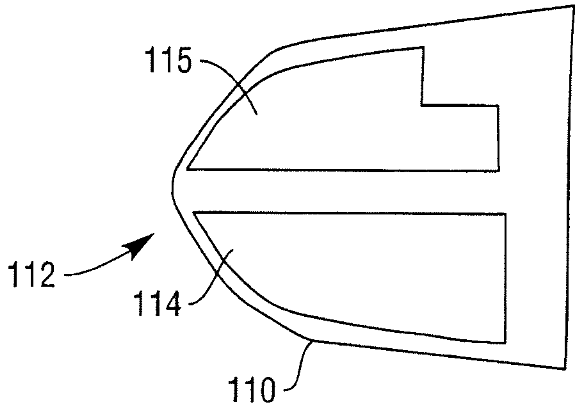
FIG. 3 is a plan view of a foreign body sensor according to the invention.
Figure 4:
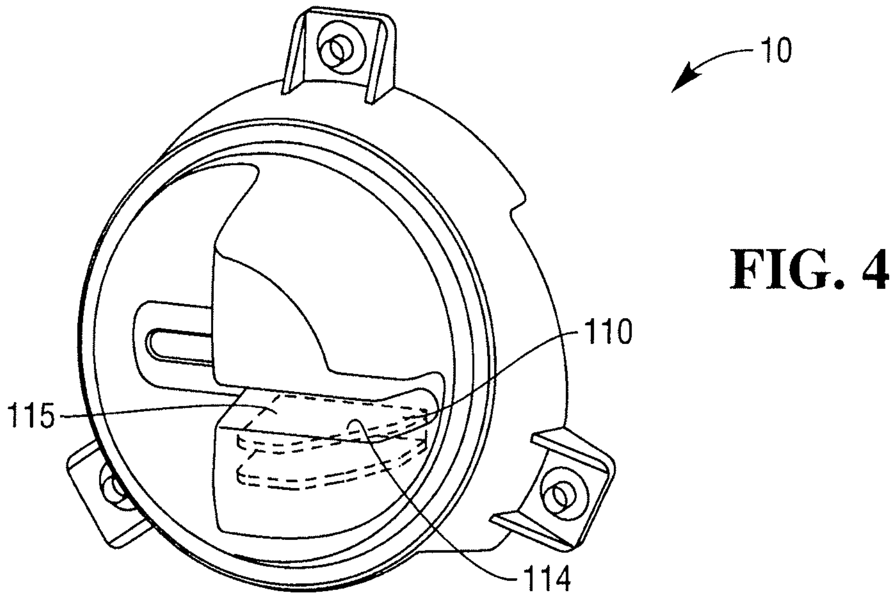
FIG. 4 is a perspective view of the card reader guide of FIG. 1 with the planar section of the first, lower protrusion shown as partly transparent to reveal the sensor located therein.

With reference to FIG. 3, a sensor 112 comprises a track printed circuit board (pcb) 110 and an electronic drive circuit (not shown) located beneath the pcb 110. The sensor 112 is dimensioned so as to fit within the sensor cavity 70, as shown in FIG. 4, and is adapted to detect foreign bodies and to distinguish between different types.

The sensor 112 comprises a transmit plate 114 and a receive plate 115 (although since an alternating voltage is being applied, the transmit plate 114 will actually function as a receive plate for half of the cycle, similarly, the transmit plate 114 will act as a receive plate for half of the cycle). An alternating voltage is applied across the transmit and receive plates 114, 115, which creates an electric field, with the air gap between the plates 114, 115 providing the dielectric. The location of the sensor 112 means that the electric field is generated in the region of the path of the magnetic stripe 45 of a data card 42 as it is inserted into the ATM. This optimises the possibility of the sensor 112 sensing a magnetic read head (not shown) because a read head needs to be located at a point over which the magnetic stripe 45 passes.

Figure 8:
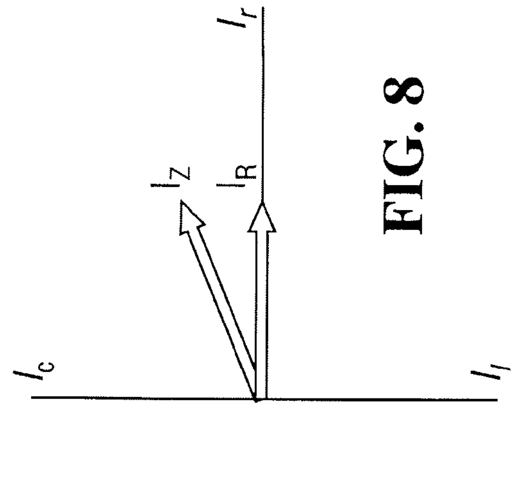
FIG. 8 is a phasor diagram illustrating the complex current and its real component for the sensor with respect to the applied voltage of FIG. 5.
Figure 5:
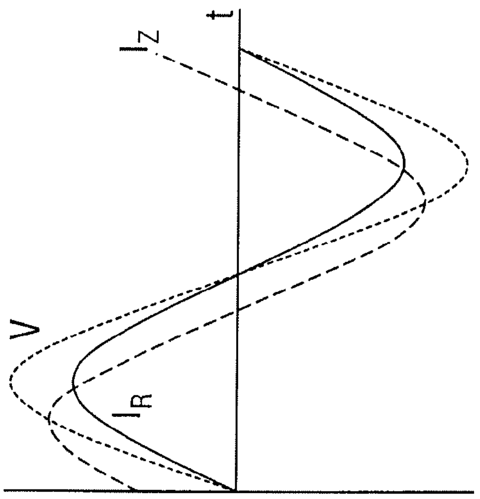
FIG. 5 is a graphical representation of the relationship between the applied voltage and current in a sensor according to the invention.

With reference to FIG. 5, the sensor 112 is set up in the absence of a foreign body, which is termed "the steady state". A sinusoidal alternating voltage V is applied to the transmit plate 114. The resultant current $I_z$, due to impedance, leads the applied voltage V by less than 90°. This is illustrated by the phasor diagram in FIG. 8. In the phasor diagram purely capacitive current is represented by the positive y-axis and purely inductive current by the negative y-axis.

Figure 6:
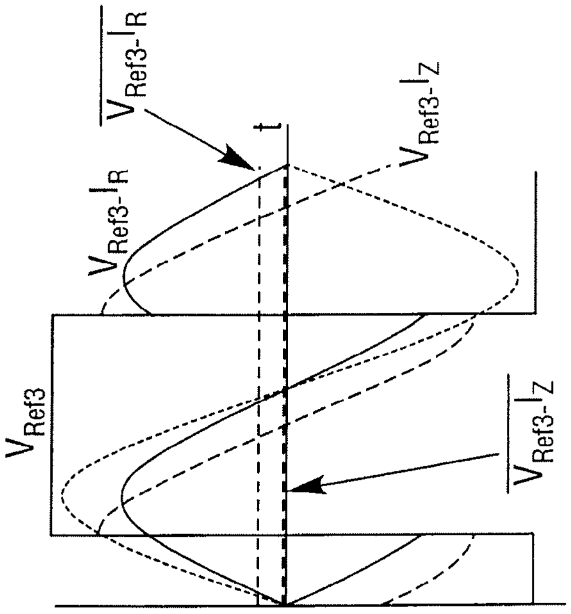
FIG. 6 is a graphical representation of the phase relationship between the current illustrated in FIG. 5 and a reference voltage, the products of the reference voltage and the current, and the average values of those products.

With reference to FIG. 6, a discontinuous curve, labelled as $V_{Ref3} \cdot I_z$, represents the product of the current $I_z$ in the steady state and a square wave reference voltage $V_{Ref3}$. Also illustrated is a curve (straight line) representing the mean of the product, labelled as $\overline{VRef3 \cdot Iz}$. The phase of the square wave voltage $V_{Ref3}$ is adjusted such that it lags the current $I_z$ by 90°, as described in more detail below. Alternatively, the square wave voltage $V_{Ref3}$ could lead the current by 90°. As a consequence, the average value of the product $\overline{VRef3 \cdot Iz}$ is approximately equal to zero, which is termed "the null condition".

Different types of foreign bodies have different impedances. As a consequence, each different body, when placed in a position that will affect the field, will cause a current to flow between the two plates 114, 115 with a phase relationship to the applied voltage that is specific to that body. In other words, the phase of the current resulting from the presence of any particular body is in effect a signature of that body. The phase of the reference voltage required to achieve a null condition for any particular current is therefore indicative of the foreign body causing that current.

So, a range of foreign bodies can each be characterised in terms of the adjustment of phase of the reference voltage required to restore the null condition. Then, in use, the phase adjustment can be taken as indicative of the likely type of sensed foreign body. For instance, when the foreign body is a magnetic head reader, a particular phase adjustment is required to restore the null condition, and when the foreign body is rainwater, a distinctly different phase adjustment is required, so the difference offers a means of distinguishing between the two.

Alternatively, it is possible to desensitise the sensor 112 to any particular body. This is done during set up by adjusting the reference voltage $V_{Ref3}$ such that its phase achieves a null condition when a particular foreign body affects the field. In use, a null condition suggests that the particular foreign body is present. Anything other than a null condition suggests that another foreign body is present.

Figure 7:
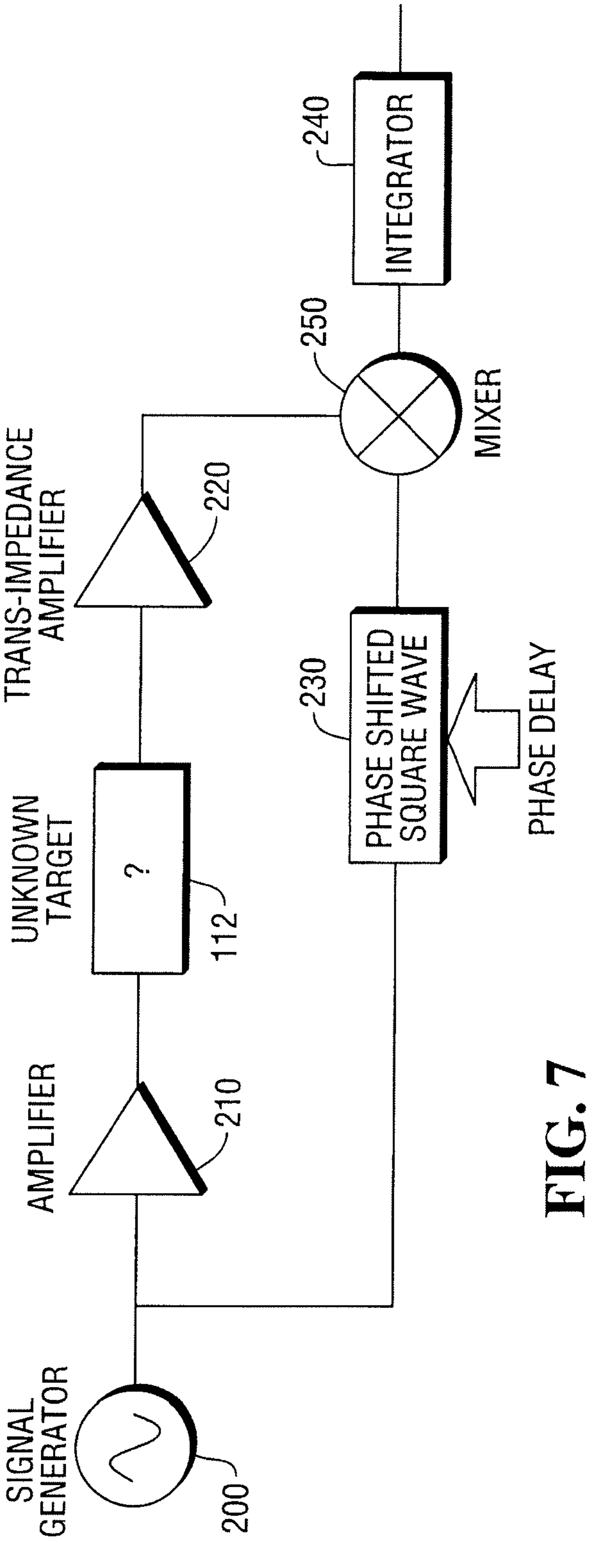
FIG. 7 is a schematic circuit layout of a sensor according to the invention.

With reference to FIG. 7, the electronic drive circuitry located beneath the pcb 110 comprises a signal generator 200 which applies an alternating voltage to the sensor 112 via an amplifier 210. A trans-impedance amplifier 220 produces a voltage wave form corresponding to the current $I_z$ flowing between the plates 114, 115. The alternating voltage from the signal generator 200 is also supplied to a phase shifter 230 which outputs a phase shifted version of its input, the phase shift being adjustable (in this embodiment adjustment is performed automatically by a microprocessor), as illustrated in FIG. 7. The voltage waveform from the trans-impedance amplifier 220 and the output from the phase shifter 230 are mixed in a four quadrant mixer 250 to obtain the product of the phase shifter reference voltage and the voltage corresponding to the current $I_z$. The average value of the complex waveform of the output of the mixer is then computed by integrator 240 (using a root mean square approach). The phase shift of the phase shifter 230 is adjusted by the microprocessor (not shown) until the null condition is achieved.

Throughout the description and claims of this specification, the words "comprise" and "contain" and variations of them mean "including but not limited to" and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of the features and/or steps are mutually exclusive. The invention is not restricted to any details of any foregoing embodiments. The invention extends to any novel one, or novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

What is claimed is:

1. A method of operating a sensor comprising a first transmit plate, a second receive plate and a dielectric material between the two plates, the method comprising the steps of:

applying an alternating voltage across the transmit and receive plates thereby to create an alternating electric field, which applied voltage results in a current flowing between the two plates;

producing a voltage signal corresponding to the resultant current;

determining the average value of the product of the corresponding voltage signal and a reference voltage signal; and adjusting the phase of the reference voltage until a null condition is achieved, at which condition the average value is approximately zero;

wherein the phase of the reference voltage is readjusted to restore the null condition when a foreign body is so positioned relative to the field as to affect the field and cause a different current to flow between the plates, and wherein the readjustment is indicative of the type of foreign body.

2. A method according to claim 1, wherein the sensor is desensitised by adjusting the phase of the reference voltage such that a null condition is achieved when a particular foreign body is so positioned relative to the field as to affect the field and cause a different current to flow through the plates, wherein an additional foreign body is so positioned relative to the field as to affect the field and cause another different current to flow through the plates, wherein the phase of the reference voltage is further readjusted to restore the null condition, and wherein the further readjustment is indicative of the type of foreign body.

3. A method according to claim 1, wherein the applied alternating voltage has a symmetric alternating waveform.

4. A method according to claim 1, wherein the reference voltage has a symmetric alternating waveform.

5. A method according to claim 1, wherein the reference voltage may lag or lead the applied voltage by 90°.

6. A self-service terminal operated according to the method claim 1.

7. A sensor comprising:

a first transmit plate;

a second receive plate;

dielectric material between the two plates;

a voltage generator for generating an alternating reference voltage signal applied across the transmit and receive plates thereby to create an alternating electric field, which applied voltage results in a current flowing between the two plates;

a convertor producing a voltage signal corresponding to the resultant current;

a calculating arrangement determining the average value of the product of the corresponding voltage signal and the alternating reference voltage signal; and a phase shifter adjusting the phase of the reference voltage signal until a null condition is achieved, at which condition the average value is approximately equal to zero;

wherein the phase of the reference voltage is readjusted to restore the null condition when a foreign body is so positioned relative to the field as to affect the field and cause a different current to flow between the plates, and wherein the readjustment is indicative of the type of foreign body.

8. A sensor according to claim 7, wherein the dielectric is air.

9. A sensor according to claim 7, wherein the applied alternating voltage is applied via an amplifier.

10. A sensor according to claim 7, wherein the converter is a trans-impedance amplifier.

11. A sensor according to claim 7, wherein the calculating arrangement comprises a mixer and an integrator.

12. A self-service terminal comprising a sensor according to claim 8.

13. A method of operating a sensor comprising a first transmit plate, a second receive plate and a dielectric material between the two plates, the method comprising the steps of:

applying an alternating voltage across the transmit and receive plates thereby to create an alternating electric field, which applied voltage results in a current flowing between the two plates;

producing a voltage signal corresponding to the resultant current;

determining the average value of the product of the corresponding voltage signal and a reference voltage signal; and adjusting the phase of the reference voltage until a particular condition is achieved;

readjusting the phase of the reference voltage to restore the particular condition when a foreign body is so positioned relative to the field as to affect the field and cause a different current to flow between the plates; and characterizing the foreign body based upon the phase of the reference voltage after readjustment.

14. A method of operating a sensor comprising a first transmit plate, a second receive plate and a dielectric material between the two plates, the method comprising the steps of:

applying an alternating voltage across the transmit and receive plates thereby to create an alternating electric field, which applied voltage results in a current flowing between the two plates;

producing a voltage signal corresponding to the resultant current;

determining the average value of the product of the corresponding voltage signal and a reference voltage signal; and adjusting the phase of the reference voltage until a null condition is achieved, at which condition the average value is approximately zero;

wherein the sensor is desensitised by adjusting the phase of the reference voltage such that a null condition is achieved when a particular foreign body is so positioned relative to the field as to affect the field and cause a different current to flow through the plates, wherein an additional foreign body is so positioned relative to the field as to affect the field and cause another different current to flow through the plates, wherein the phase of the reference voltage is further readjusted to restore the null condition, and wherein the further readjustment is indicative of the type of foreign body.

* * * * *